US010215823B2

United States Patent
Schneider

(10) Patent No.: US 10,215,823 B2
(45) Date of Patent: Feb. 26, 2019

(54) MAGNETIC RESONANCE APPARATUS, AND METHOD FOR DETERMINING THE POSITION OF A RECEPTION COIL IN THE SCANNER THEREOF

(71) Applicant: Siemens Healthcare GmbH, Erlangen (DE)

(72) Inventor: Rainer Schneider, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 110 days.

(21) Appl. No.: 15/582,254

(22) Filed: Apr. 28, 2017

(65) Prior Publication Data

US 2017/0315197 A1    Nov. 2, 2017

(30) Foreign Application Priority Data

Apr. 29, 2016 (DE) .......................... 10 2016 207 351

(51) Int. Cl.
  *G01V 3/00* (2006.01)
  *G01R 33/54* (2006.01)
  *G01R 33/32* (2006.01)
  *G01R 33/385* (2006.01)

(52) U.S. Cl.
  CPC .......... *G01R 33/543* (2013.01); *G01R 33/32* (2013.01); *G01R 33/385* (2013.01)

(58) Field of Classification Search
  USPC ...................................................... 324/318
  See application file for complete search history.

(56) References Cited

U.S. PATENT DOCUMENTS

| 6,073,043 A * | 6/2000 | Schneider ................ A61B 5/06 128/899 |
| 2003/0120146 A1 * | 6/2003 | Dumoulin .............. A61B 5/055 600/410 |
| 2010/0210938 A1 * | 8/2010 | Verard ............... A61B 1/00071 600/424 |
| 2013/0085377 A1 | 4/2013 | Barbot et al. |
| 2014/0145717 A1 * | 5/2014 | Ozawa ............... G01R 33/3664 324/307 |

(Continued)

OTHER PUBLICATIONS

Daniels, et al. "Optimizing Accuracy and Precision of Micro-coil Localization in Active-MR Tracking", Magnetic Resonance Imaging, vol. 34, (2016), pp. 289-297.

(Continued)

*Primary Examiner* — Rodney E Fuller
(74) *Attorney, Agent, or Firm* — Schiff Hardin LLP

(57) ABSTRACT

In order to determine the position of a reception coil in a magnetic resonance (MR) scanner of an MR apparatus, wherein the instrument has a reception coil, MR data are acquired from the reception coil along one direction in the scanner, and are provided to a processor that determines a position specification from the acquired MR data. The processor determines the position specification by initially executing a training period, using a first position specification establishment method, in order to produce a training period dataset, and then the training period dataset is used to establish a final position specification with a second position specification establishment method that differs from the first position specification establishment method.

18 Claims, 2 Drawing Sheets

(56) References Cited

U.S. PATENT DOCUMENTS

2016/0209484 A1* 7/2016 Bauer ................. G01R 33/543

OTHER PUBLICATIONS

Barbot et. al.: "Accurate Localization of Active Devices during Interventional MR Imaging", Proc. Intl. Soc. Mag. Reson. Med., vol. 19, (2011), p. 1747.
Dumoulin, "Phase-field dithering for active catheter tracking": Magnetic Resonance in Medicine, vol. 63.5 (2010), pp. 1398-1403.

* cited by examiner

MAGNETIC RESONANCE APPARATUS, AND METHOD FOR DETERMINING THE POSITION OF A RECEPTION COIL IN THE SCANNER THEREOF

BACKGROUND OF THE INVENTION

Field of the Invention

The invention concerns a method for determining position information of a reception coil arranged on an instrument to be localized within a magnetic resonance (MR) data acquisition scanner of an MR apparatus, wherein, by using a direction of the read-out gradient, one-dimensional magnetic resonance data will be recorded by the scanner, and a peak structure of the magnetic resonance data to be assigned to the reception coil will be evaluated as position information in order to establish a position specification in that direction. The invention also concerns a magnetic resonance apparatus, as well as a non-transitory, computer-readable data storage medium encoded with programming instructions, designed to implement such a method.

Description of the Prior Art

Magnetic resonance imaging is increasingly being used in the medical field for monitoring interventions on a patient. In such cases an increasing number of so-called "active instruments" exist in interventional magnetic resonance imaging (iMRI), which interact with the magnetic resonance apparatus and are intended to actively support the intervention. Examples of such instruments are magnetic-resonance-compatible catheters, magnetic-resonance-compatible treatment needles, stereotactic frames and HIFU devices. For image monitoring of an intervention or of another activity, it is desirable to determine the current position of such instruments as exactly as possible in order to be able to plan, monitor or evaluate the intervention.

In order to allow the position to be determined with the use of the magnetic resonance apparatus, such instruments have one or more radio-frequency (RF) micro coils tuned to the magnetic resonance frequency, which are referred to below as reception coils. If such reception coils, in a similar way to conventional local coils of magnetic resonance imaging, are coupled to the magnetic resonance apparatus, in particular to a reception device of the control computer of the magnetic resonance apparatus, the measured magnetic resonance signal of these micro coils can be recorded and used in order to carry out a determination of the position of the reception coil and thus a localization of the instrument. In such cases it has been proposed that one-dimensional projections be recorded, which means using MR data acquired with a magnetic resonance sequence in which only one read-out gradient will be employed, in order to be able to establish a position specification along the corresponding direction of the read-out gradient. Usually in such cases, at least three directions of the read-out gradient at right angles to one another along the physical axes of the magnetic resonance device will be used, in order to determine the x, y and z coordinates of the individual reception coils as position specifications. In such cases, however, it has proven difficult to detect the center of the coil or the coil coordinates in the raw signal, i.e. the one-dimensional magnetic resonance data in the spatial domain, since the signal characteristic of the projections in the different directions depends on the physical form of the reception coil, the measurement chain, the orientation of the reception coil, and the degree of coupling with other coils of the magnetic resonance scanner. It has been shown that even in the static case, meaning that the instrument does not move and thus the coil does not move, even though the magnetic resonance data has a similar peak structure, it still varies as to amplitude and signal-to-noise ratio.

In order to be able to determine the coil coordinates, i.e. a position specification in the direction of the read-out gradient in one-dimensional magnetic resonance data, a number of evaluation methods have been proposed, but offer only a limited accuracy.

As the simplest option, the position specification will be identified with the measured signal maximum in the one-dimensional magnetic resonance data. However, the signal maximum is neither the center of the coil, nor does the signal maximum have to correlate with the coil at all, if couplings to other coils are present. Accordingly this method of operation is neither accurate nor robust.

In an article by Charles L. Dumoulin et al., "Phase-Field Dithering for Active Catheter Tracking", Magnetic Resonance in Medicine 63:1398-1403 (2010), a phase-field dithering method has been proposed for active catheter tracking. In this method, dephasing magnetic field gradient pulses are used, which are orthogonal to the read-out gradient pulse, in order to create a location-dependent phase displacement in directions at right angles to the direction of the read-out gradient. Undesired magnetic resonance signals, which originate from larger volumes, such as due to couplings with body coils or local coils, will be dephased and reduced in their signal intensity, while the influence on the small reception coil is only extremely slight. In this way the ratio of the signal level of the peak structure to be assigned to the reception coil in the magnetic resonance data to noise and to disruptive signals will be increased, so that a higher signal quality is produced. In this procedure, however, the problem of determining the position as accurately as possible along the direction of the read-out gradient is not resolved.

In an article by Barret Robert Daniels et al., "Optimizing accuracy and precision of micro-coil localization in active-MR tracking", Magnetic Resonance Imaging 34: 289-297 (2016), as well as in a short article by Barret Daniels et al., "Optimizing Accuracy and Precision of Micro-coil Localization in Active MR Tracking under low SNR conditions", Proc. Intl. Soc. Magn. Reson. Med. 23: 1660 (2015), it is proposed that the position specification be determined as a signal spectral center of the peak structure to be assigned to the reception coil, using a centroid method. Since the ratio of the signal strengths in the peak structure to the noise, as well as the level of the coupling signals, vary over time and location, a more robust, but not exceptionally precise, alternative for determining the position specification is provided.

In an article by J. Barbot et al., "Accurate Localization of Active Devices during Interventional MR Imaging", Proc. Intl. Soc. Mag. Reson. Med. 19: 1747 (2011), it is proposed that simulated projection signals (model data) be established for a solenoid reception coil and that the model data be cross-correlated with the magnetic resonance data, in order to improve the localization of a catheter. With this process, the position of the reception coil can be determined uniquely and robustly by correlation, provided the orientation or shape of the reception coil does not change. The method is very robust in relation to amplitudes or noise level changes and offers a good approach, but suffers from the problem that the characteristics, in particular the orientation, of the coil must be known exactly, in order to obtain reliable information.

SUMMARY OF THE INVENTION

An object of the present invention is therefore to provide an improved option compared to those described above for determining the position specification of a reception coil in the direction of the read-out gradient from one-dimensional magnetic resonance data.

This object is achieved in accordance with the invention with a method of the general type noted initially herein but wherein, in accordance with the invention, for the position specification is established after the expiration of a training period that includes the beginning of a position determination period in a second establishment method, by correlation of the one-dimensional magnetic resonance data in the spatial domain with one-dimensional comparison data established in the training period. In accordance with the invention, in order to establish the comparison data in the training period, a position specification is established in a first method of establishment differing from the second method of establishment and, upon fulfillment of a training criterion regarding the quality of the magnetic resonance data and/or the position specification, the magnetic resonance data and the position specification are calculated statistically into the comparison data with an assigned comparison position specification.

Thus, in accordance with the invention, a model, described by the comparison data, will be correlated with the recorded projection signal, i.e. the one-dimensional magnetic resonance data. In contrast to the solution proposed by J. Barbot et al., however, the method according to the invention is independent of the coil shape and orientation. Reception coils (micro coils) of any given geometrical dimensions can be detected robustly for any given positions and orientations by the correlation model, given by the comparison data, by being dynamically created as well as by being adapted.

In the method according to the invention, initially in a training period, the comparison data will be established as a customized model for the reception coil involved, in which, with a conventional first method of establishment or a first method of establishment differing from the correlation with comparison data, position specifications will already be established. In this case, the position specification in the first method of establishment can be established as a signal spectral center of the peak structure and/or by using a phase field dithering method, for example, with the latter preferably also being used later during the second establishment method. The signal spectral center determination is preferred as the first method of establishment, with respect to which reference is made to the article by Daniels et al. that was noted above. By using this method of operation, it can be assumed that the estimated position specification, which relates to the center of the reception coil, is sufficiently accurate at least for a number of consecutive measurements.

If a quality check based on the training criterion is now successful, thus if specific quality conditions are fulfilled, the model in the form of the comparison data will be trained on the basis of the current one-dimensional magnetic resonance data, and the position specification established in the first method of establishment, for example by the averaging of a number of sets of projection data around the estimated position specification, as a center of the reception coil. In this way it can be said that the model given by the comparison data works itself into use by the averaging.

It should be noted that in the training period, position information can of course already be provided in the form of the position specifications given by the first method of establishment. It should also be noted that usually in each position determination period there is a very frequent repetition of the measurements for position determination, for example the establishment of the position information can be repeated with a frequency of at least 10 Hz, preferably at least 40 Hz. The position determination for active instruments in a magnetic resonance device will typically be carried out with a frequency of 10-50 Hz, so that the training period can be kept short, and to be done in a phase in which the instrument, and thus the reception coil, is immobile. Especially advantageously, a training period with an immobile reception coil will thus be used ("static phase").

In an embodiment, the training criterion can be the ratio of a signal level of the peak structure to a signal level of background noise of the magnetic resonance data, which can be compared with a threshold value. Alternatively or in addition, a check can be made as to whether a signal width of the peak structure exceeds at least one threshold value. It can thus be checked whether a sufficiently high peak-to-noise level is present, thus the peak structure stands out sufficiently clearly from the noise. For this purpose, a signal maximum and/or another identifying value of the peak structure, for example, can be referenced to an identifying value for the noise outside the peak structure, for example by dividing those values. In addition or as an alternative, it can be checked whether a specific signal window size is present around the position specification established by the first method of establishment, the location of which thus does not represent an edge point of the peak structure. It will thus be insured that no poor-quality measurement results (outliers) are included in the determination of the model, i.e. of the comparison data.

If the quality conditions described by the training criterion are fulfilled, the model will be trained. The individual magnetic resonance data and predetermined positions fulfilling the training criterion can be averaged in the training period for establishing the comparison data and the comparison position specification, and/or can be included with weightings with a quality value established within the framework of the training criterion. Thus, N sets of projection data, containing the peak structure and/or reduced to the peak structure, can be averaged around the estimated position specification established in the first method of establishment. Thus ultimately an averaged form of the peak structure is produced, while noise components are averaged out. In the second method of establishment, this comparison structure, as will be described by the comparison data, can then be ideally overlaid on a current measurement, i.e. current magnetic resonance data, so that the corresponding position specification (taking into account the comparison position specification, which acts as a type of reference) is produced. In an embodiment, individual training datasets formed from magnetic resonance data and a position specification can be weighted as a function of quality features, for example, so that within the framework of the training criterion a quality value will be determined, for example the peak-to-noise ratio already mentioned.

The training period continues until a termination criterion is fulfilled. For example, the end of the training period can be determined as a result of the termination criterion describing the quality of the comparison data, and/or the reaching of a specific number of position determinations, or an amount of magnetic resonance data included in the comparison data. For example, a check can be made as to whether a specific number of individual measurements, thus training datasets composed of magnetic resonance data and a position specification, are included in the comparison data, for example a number from 10 to 30, for example 20. It is also possible for the termination criterion to be oriented to the quality of the model arising from the comparison data, for example to use a quality value itself, which in this case will be determined for the current comparison data in the training period. In this way, a peak-to-noise ratio of the comparison data can be established as a quality value, for example, and be compared with a threshold value.

It is then possible after the training phase, by the customized model, i.e. the comparison data, and the second method of establishment, preferably using a cross-correlation, to establish a unique and robust coil position. In an optimization method, for example, a correlation value can be maximized. In this case, always starting from the last position specification determined, an optimum position of the comparison peak structure along the direction of the read-out gradient described by the comparison data will be sought, which then leads directly to a current, new position specification. The procedure can proceed as described with respect to the simulated comparison data in the article by J. Barbot et al., cited earlier.

In a preferred embodiment of the present invention, makes provision, upon fulfillment of a quality criterion for the current magnetic resonance data and/or the currently determined position specification according to the second method of establishment (corresponding to the training criterion), the comparison data are updated. The comparison data may be the peak structure in the comparison data and/or a current position specification changed by comparisons with the comparison position specification. This updating occurs taking statistical account of the current magnetic resonance data. If the current magnetic resonance data (and where necessary the position specification) thus fulfill a specific quality requirement, in particular that already described by the training criterion, this can be dynamically adapted by the model given by the comparison data, so that changes in the magnetic resonance data through a change of orientation of the reception coil can also be included. The model will in this way always be kept up to date and then also continues to deliver outstanding results for the position information, when the orientation of the instrument, and thus of the reception coil, changes within the magnetic resonance scanner, thus in general in the homogeneity volume thereof. In such cases the current position specification expediently always serves as reference point—the peak structure is assumed to extend around this, so that the peak structure of the current magnetic resonance data can update the comparison peak structure without any problems.

During the updating of the comparison data, a weighting dependent on the repetition frequency of the position determination can be selected for the current magnetic resonance data, and/or a sliding window can be used for selecting individual sets of magnetic resonance data included. For example, a weighting factor can be employed in order to easily control the dynamic adaptation rate of the model. This is preferred in comparison with using a sliding window for sliding averaging.

In an embodiment, position specifications are determined for a number of directions, preferably at right angles to one another, with separate comparison data being established and used for each of these directions. The process described herein is used for each of these directions individually, when magnetic resonance data will be determined along different directions of the read-out gradient, in order to allow robust and precise determinations of the position specifications as a part of the position information in these directions. There can be a measurement (MR data acquisition) in each of the three physical directions of the magnetic resonance scanner, in order to be able to determine an x-position, a y-position and a z-position of the reception coil.

In an experiment with 800 projections along the sagittal, coronal and transverse direction, standard deviations were established as a measure of the robustness for different prior art detection algorithms and for the present invention, for a static case. The result shows that the inventive method clearly reduces the standard deviation of the detected position specifications and shows a considerable increase in the robustness and accuracy.

In summary, the inventive process offers a robust and accurate detection of micro coils on active instruments for magnetic resonance imaging. Accurate results are achieved with the invention regardless of the coil shape and regardless of the coil orientation. The algorithm is also robust with regard to changing amplitudes and noise levels.

In addition to the method, the invention also concerns a medical apparatus, having a medical instrument, in particular a catheter, for use in a magnetic resonance scanner of the apparatus, wherein the medical instrument has at least one reception coil, and the apparatus has a control computer designed to implement the inventive method. Thus the medical apparatus is a combination of the magnetic resonance scanner and the medical instrument, wherein the reception coil of the medical instrument is in communication with a signal input of the control computer. All statements made in relation to the inventive method are applicable to the inventive medical apparatus, which thus achieves the same advantages as described for the method.

The invention also encompasses a non-transitory, computer-readable data storage medium encoded with programming instructions, the storage medium being loadable into a control computer of a magnetic resonance apparatus, and the programming instructions causing the control computer to implement the method as described above, when the programming instructions are executed by the control computer. The storage medium may be a CD-ROM, a memory stick, a dongle, or the like.

DESCRIPTION OF THE PREFERRED EMBODIMENTS

Figure 1:
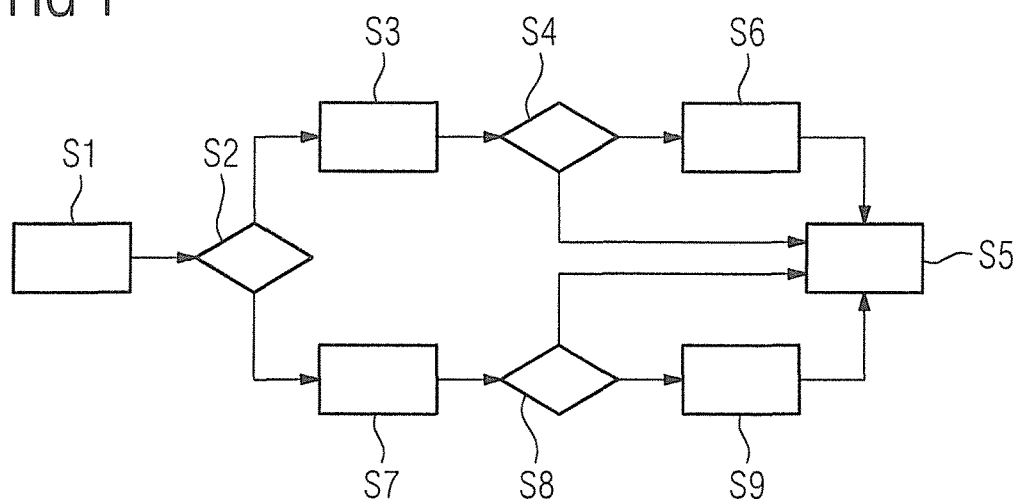
FIG. 1 is a flowchart of an exemplary embodiment of the inventive method.

FIG. 1 is a flowchart of an exemplary embodiment of the inventive method for position determination of a reception coil of a medical instrument in the homogeneity volume of a magnetic resonance device. This instrument is a so-called active instrument that is linked into the operation of the magnetic resonance apparatus. The reception coils provide their received magnetic resonance data to an input stage of the control computer of the magnetic resonance apparatus, where the data can be evaluated in order to establish the position information of the reception coil. In the present example, position specifications, which relate to the center of the reception coil (micro coil), will be established in three directions at right angles to each other, which correspond to the physical directions of the magnetic resonance device. For each of these directions, individual one-dimensional measurements to record one-dimensional magnetic resonance data will be carried out by, during the corresponding magnetic resonance sequence, activating only one read-out gradient in the direction under consideration. The exemplary embodiment presented below can be applied to all three directions, but for simplicity will be presented only for one direction.

In a step S1, using a magnetic resonance sequence with a read-out gradient in the direction currently under consideration, one-dimensional magnetic resonance data will be recorded with the reception coil. Then, in a step S2, a check will be made whether a termination criterion of a training period, which takes place at the beginning of a position determination period, is already fulfilled. If one of the first measurements is involved, which in addition will be carried out here with a frequency of 40 Hz, the termination criterion is not yet fulfilled in step S2, which means that the training period is still ongoing. Then, in a step S3, using a first method of establishment, a position specification in the direction of the read-out gradient is established. In the exemplary embodiment, a signal spectral center of a peak structure in the magnetic resonance data assigned to the reception coil will be established.

Figure 2:
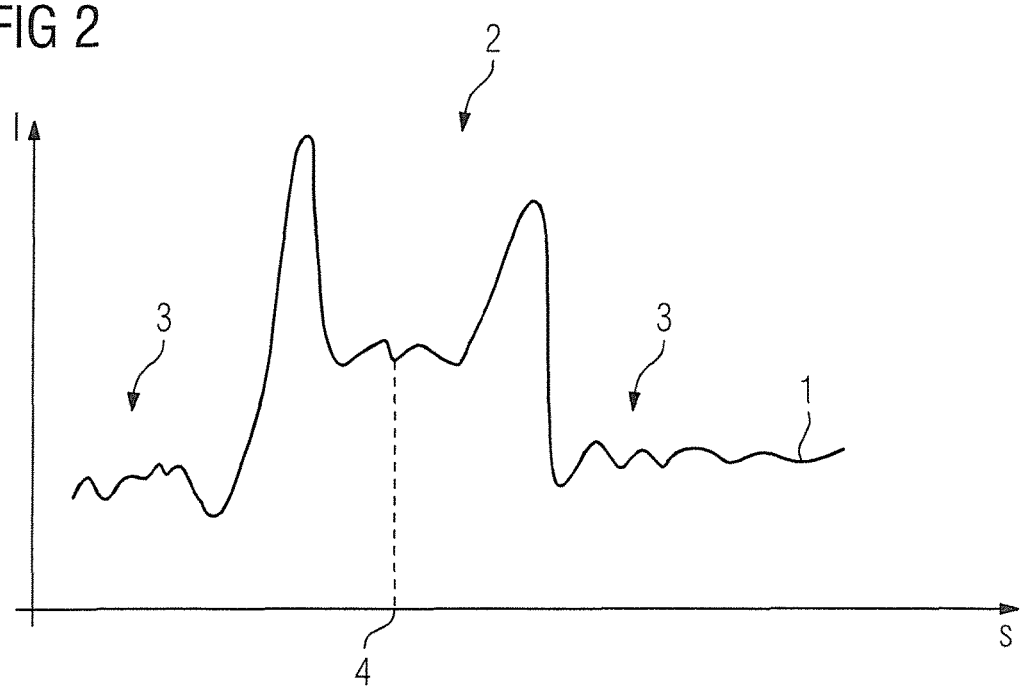
FIG. 2 shows an example of a signal curve for magnetic resonance data, for use in explaining the invention.

For explanation, FIG. 2 shows a curve 1 of magnetic resonance data, plotted as intensity I against the space coordinates in the direction under consideration. It can be seen that a peak structure 2 clearly stands out from noise components 3. The peak structure 2 is characterized here by two outer maxima, between which the signal falls again. If, for example, the centroid method is used as a method for determining the signal spectral center, the position specification 4 is produced, which designates the center of the reception coil in the direction currently considered.

In a step S4, a check will be made with respect to a training criterion, as to whether the quality of the training dataset from current magnetic resonance data and currently determined position specification 4 is sufficiently high to be included in a model. In the present example, a peak-to-noise ratio is checked against a threshold value, in which the maximum value of the magnetic resonance data in the peak structure 2 will be compared with a representative value of the noise components 3 outside the peak structure 2, for example divided by a corresponding average value.

If the training criterion is not fulfilled in step S4, in a step S5 the position specification 4, as has been established in step S3, is added to the current position information and this is used accordingly. If, however, the training dataset is suitable for improving the model, training of the model occurs in step S6. One-dimensional comparison data are established by averaging the one-dimensional magnetic resonance data of the training datasets, in each case around the position specification, wherein the comparison position specification is further produced as an average of all position specifications. A weighting can be undertaken here, for example on the basis of the peak-to-noise ratio determined in step S4 as the quality value. Since noise components thus average out, a customized model for the reception coil thus arises over time, which is characterized by a comparison peak structure in the comparison data. It should be noted that the training period, since it usually lasts for less than a second, and lies at the beginning of the position determination period, and usually takes place with an immobile reception coil, which otherwise would have to be expediently insured.

The termination criterion in step S2 is fulfilled if either a sufficient number of training datasets have been included in the comparison data and the comparison position specification, or also if the peak-to-noise ratio of the comparison data exceeds a threshold value. Then the training period is ended and in step S7 a second method of establishment is used, in order to establish highly-accurate position specifications 4. In this step a cross-correlation of the comparison data and the current magnetic resonance data takes place such that a position of highest correlation value along the direction of the read-out gradient delivers the position specification. Thus the customized made model described by the comparison data is applied, in order to determine as precisely as possible the peak structure 2 in the current magnetic resonance data, from which the precise and robustly determined position specification then follows. It should also be noted that it can be expedient during the entire method to employ a phase-field dithering method, in order to suppress coupling components of the magnetic resonance data and/or other noise components, and to let the peak structure 2 come to the fore as clearly as possible.

In order to keep the model up-to-date, and to be able to trace changes to the peak structure 2 caused by a change of orientation of the reception coil, a continual dynamic adaptation of the comparison data takes place. For this purpose, a check is made in a step S8 as to whether a quality criterion is fulfilled, which in the present example corresponds to the training criterion of step S4. If it is not fulfilled, the current magnetic resonance data and the current position specification 4 are of a quality that is too poor, and will not be used for updating the model, so that the process will be continued with step S5. If, however, the quality criterion is fulfilled in step S8, in step S9 there is an updating of the comparison data. For this purpose, at least the form of the peak structure 2 in the comparison data, naturally taking into account a current position specification 4 changed in relation to the comparison position specification, is statistically updated via the current magnetic resonance data. In the present example, this is done by the current magnetic resonance data being averaged weighted into the comparison data, wherein the weighting factor is determined as a function of the repetition frequency of the position determination.

It should be noted again that the method can be employed not only for different directions, in particular the three basic physical directions of the magnetic resonance device standing at right angles to one another, but also for different reception coils of one or more instruments.

Figure 3:
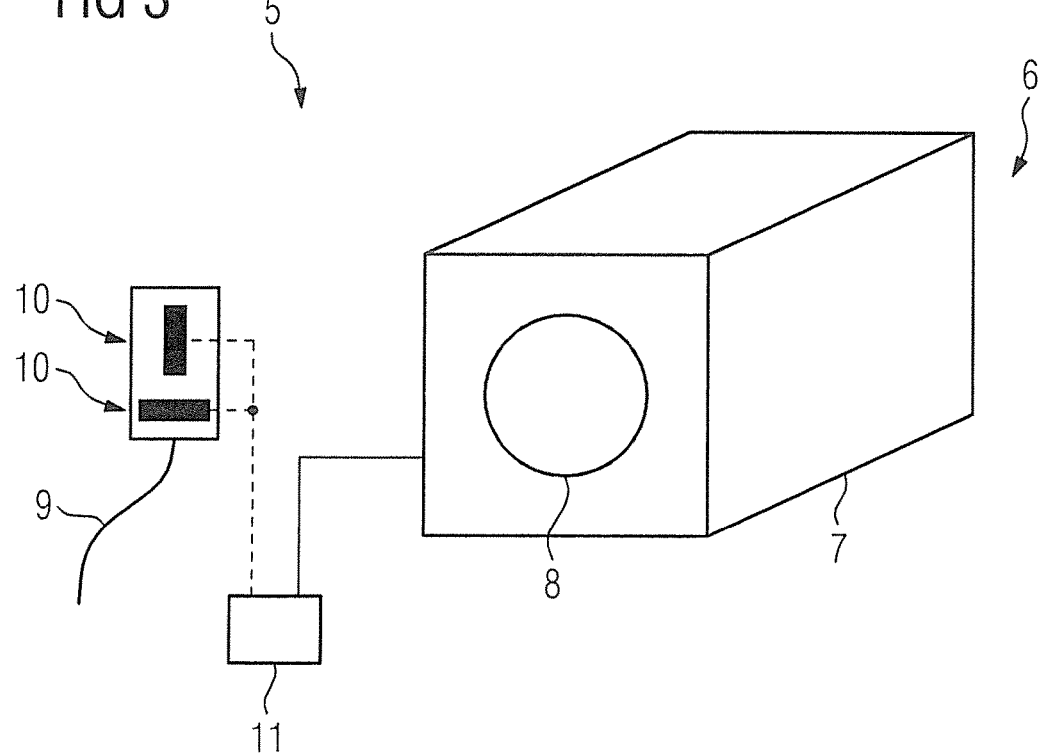
FIG. 3 is a block diagram of an inventive magnetic resonance apparatus.

FIG. 3 is a block diagram of an inventive medical apparatus 5. This can be used for carrying out interventions under magnetic resonance imaging supervision. To this end, the medical apparatus 5 has a magnetic resonance scanner 6, which, as is usual, has a basic field magnet unit 7 that defines the patient receiving area 8. The homogeneity volume also lies in this area 8. Usually the cylindrical patient receiving area 8 is surrounded by a radio-frequency coil arrangement, and a patient bed is provided that is movable into the patient receiving area 8. These components are not shown for simplicity. The medical apparatus 5 further includes a medical instrument 9, here a catheter for use in a patient. In order to enable the position of the catheter 9 to be determined in the homogeneity volume of the magnetic resonance scanner 6, two differently-oriented reception coils 10 are provided in the catheter head in the present example. Since an active instrument 9 is involved, the reception coils 10 deliver their magnetic resonance data, as indicated by dashed lines, to a control computer 11 of the magnetic resonance scanner 6, handy to an input stage of the control computer 11. For this purpose, an appropriate plug, which is assigned to the instrument 9, will be plugged into a socket for a local coil on the patient bed (not shown).

The control computer 11 is designed for implementing the inventive method, meaning that it records one-dimensional magnetic resonance data at a specific frequency, for example 40 Hz, by activating the corresponding components of the magnetic resonance scanner 6 and reading out the reception coils 10, which are designed as micro coils, and evaluates the data in accordance with steps S2-S9, as described above. To this end, the control computer 11 can include an evaluation processor and where necessary a training processor for the model given by the comparison data.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining position information about a reception coil of an instrument that is to be localized within a magnetic resonance data acquisition scanner, said method comprising:
    operating said magnetic resonance data acquisition scanner to acquire magnetic resonance data from said reception coil by activating a read-out gradient in a single direction, and thereby obtaining, as said magnetic resonance data, one-dimensional magnetic resonance data having a peak structure;
    providing said magnetic resonance data from said reception coil to a processor and, in said processor, executing a training period comprising a plurality of iterations in each of which at least one training period dataset is generated by establishing a position specification, dependent on said peak structure, of said reception coil, said position specification designating a position of said reception coil in said scanner in a direction of said one-dimensional magnetic resonance data, using a first position specification establishing method and, upon fulfillment of a training criterion designating at least one of quality of the magnetic resonance data or quality of said position specification, terminating said training period and producing said at least one training data set by statistically calculating each position specification from each iteration of said training period into a training period position specification represented in said at least one training period dataset;
    after completion of said training period, determining a final position specification of said reception coil in said magnetic resonance scanner using a second position specification establishing method, that differs from said first position specification establishment method, by correlating said one-dimensional magnetic resonance data with said at least one training dataset obtained in said training period, and making said final position specification of said reception coil available in electronic form as an output from said processor.

2. A method as claimed in claim 1 comprising establishing said position specification in said training period in said first position specification establishment method as at least one of establishment of a signal spectral center of said peak structure, and using a phase-field dithering method.

3. A method as claimed in claim 1 comprising using, as said training criterion, a ratio of a signal level of the peak structure to a signal level of background noise of said magnetic resonance data, and comparing said ratio to a threshold value.

4. A method as claimed in claim 1 comprising using, as said training criterion, a check as to whether at least one signal width of said peak structure exceeds a threshold value around said position specification.

5. A method as claimed in claim 1 comprising averaging a result of each iteration of said training period for which said training criterion was satisfied, in order to produce said training period position specification in said at least one training period dataset.

6. A method as claimed in claim 1 comprising providing each training period position specification produced in each iteration of said training period for which said training criterion was fulfilled with a respective weighting that represents a quality value of that training period position specification, and generating said training period position specification in said at least one training period dataset as a combination of the respectively weighted training period position specifications.

7. A method as claimed in claim 1 comprising executing said training period based on an assumption that said reception coil is immobile in said MR data acquisition scanner.

8. A method as claimed in claim 1 comprising terminating said training period upon satisfaction of a termination criterion that designates a quality of the training period position specification produced in a currently last iteration of said training period.

9. A method as claimed in claim 8 comprising using, as said termination criterion, a comparison to a threshold value of a ratio of a signal level of the peak structure to a signal level of background noise.

10. A method as claimed in claim 1 comprising terminating said training period upon execution of a predetermined number of said iterations.

11. A method as claimed in claim 1 comprising, during said correlation in said second position specification establishment method, executing at least one of a cross-correlation and a maximization of a correlation value.

12. A method as claimed in claim 1 comprising updating said final position specification upon occurrence of a predetermined change in said magnetic resonance data or said final position specification.

13. A method as claimed in claim 12 comprising updating said final position specification by providing a weighting, dependent on a repetition frequency of determination of said final position specification, to at least one preceding final position specification, and using the weighted previous final position specification to update a current final position specification.

14. A method as claimed in claim 12 comprising using a sliding window to select magnetic resonance data that will be included in said updating.

15. A method as claimed in claim 1 comprising determining said final position specification for each of a plurality of directions, with separate comparison data being established and used for each of said separate directions.

16. A method as claimed in claim 15 wherein said separate directions are orthogonal to each other.

17. A magnetic resonance (MR) apparatus comprising:
    an MR data acquisition scanner and an instrument having a reception coil that is movably positionable in the MR data acquisition scanner, and a gradient coil arrangement in said MR data acquisition scanner;
    a computer configured to operate said MR data acquisition scanner to acquire MR data from said reception coil by operating said gradient coil arrangement to activate a read-out gradient in a single direction, and thereby obtaining, as said magnetic resonance data, one-dimensional magnetic resonance data having a peak structure;

said computer being provided with said MR data from said reception coil and said computer being configured to execute a training period comprising a plurality of iterations in each of which at least one training period dataset is generated by establishing a position specification, dependent on said peak structure, of said reception coil, said position specification designating a position of said reception coil in said scanner in a direction of said one-dimensional magnetic resonance data, using a first position specification establishing method and, upon fulfillment of a training criterion designating at least one of quality of the magnetic resonance data or quality of said position specification, terminating said training period and producing said at least one training data set by statistically calculating each position specification from each iteration of said training period into a training period position specification represented in said at least one training period dataset;

said computer being configured, after completion of said training period, to determine a final position specification of said reception coil in said magnetic resonance scanner using a second position specification establishing method, that differs from said first position specification establishment method, by correlating said one-dimensional magnetic resonance data with said at least one training dataset obtained in said training period, and making said final position specification of said reception coil available in electronic form as an output from said computer.

18. A non-transitory, computer-readable data storage medium encoded with programming instructions, said storage medium being loaded into a processor of a magnetic resonance apparatus, that has a magnetic resonance data acquisition scanner with an instrument therein, said instrument comprising a reception coil, and said programming instructions causing said processor to:

operate said magnetic resonance data acquisition scanner to acquire magnetic resonance data from said reception coil by activating a read-out gradient in a single direction, and thereby obtaining, as said magnetic resonance data, one-dimensional magnetic resonance data having a peak structure;

execute a training period comprising a plurality of iterations in each of which at least one training period dataset is generated by repeatedly establishing a position specification, dependent on said peak structure, of said reception coil, said position specification designating a position of said reception coil in said scanner in a direction of said one-dimensional magnetic resonance data, using a first position specification establishing method and, upon fulfillment of a training criterion designating at least one of quality of the magnetic resonance data or quality of said position specification, terminating said training period and producing said at least one training data set by statistically calculating each position specification from each iteration of said training period into a training period position specification represented in said at least one training period dataset;

after completion of said training period, determine a final position specification of said reception coil in said magnetic resonance scanner using a second position specification establishing method, that differs from said first position specification establishment method, by correlating said one-dimensional magnetic resonance data with said at least one training dataset obtained in said training period, and make said final position specification of said reception coil available in electronic form as an output from said processor.

* * * * *